(12) United States Patent
Yamada (10) Patent No.: US 7,280,413 B2
(45) Date of Patent: Oct. 9, 2007

(54) NONVOLATILE SEMICONDUCTOR MEMORY

(75) Inventor: Shigekazu Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 355 days.

(21) Appl. No.: 11/124,253

(22) Filed: May 9, 2005

(65) Prior Publication Data
US 2005/0201159 A1    Sep. 15, 2005

Related U.S. Application Data

(63) Continuation of application No. PCT/JP03/05280, filed on Apr. 24, 2003.

(51) Int. Cl.
*G11C 5/14*    (2006.01)

(52) U.S. Cl. .................. 365/189.09; 365/189.02; 365/185.18; 365/185.22; 365/185.24

(58) Field of Classification Search ........ 365/189.09, 365/189.02, 185.18, 185.22, 185.24
See application file for complete search history.

(56) References Cited

U.S. PATENT DOCUMENTS

| | | | | |
|---|---|---|---|---|
| 5,258,958 A | * | 11/1993 | Iwahashi et al. | 365/185.21 |
| 5,487,034 A | * | 1/1996 | Inoue | 365/185.18 |
| 5,526,307 A | * | 6/1996 | Yiu et al. | 365/185.01 |
| 5,555,204 A | * | 9/1996 | Endoh et al. | 365/185.22 |
| 6,301,154 B1 | * | 10/2001 | Sumitani | 365/185.18 |
| 6,680,868 B2 | | 1/2004 | Akamatsu | |

FOREIGN PATENT DOCUMENTS

| | | |
|---|---|---|
| JP | 58-114396 | 7/1983 |
| JP | 6-203590 | 7/1994 |
| JP | 7-169284 | 7/1995 |
| JP | 9-506203 | 6/1997 |
| JP | 11-25681 | 1/1999 |

* cited by examiner

*Primary Examiner*—Richard T. Elms
*Assistant Examiner*—Eric Wendler
(74) *Attorney, Agent, or Firm*—Arent Fox, LLP.

(57) ABSTRACT

A transmission transistor transmitting a drain voltage is connected to an electrically rewritable nonvolatile memory cell. An operation control circuit controls program operation for increasing a threshold voltage of the memory cell, and verify operation which is performed before and after the program operation in order to verify the threshold voltage of the memory cell. A drain switching circuit connects during the verify operation a gate of the transmission transistor to a first voltage line through which a first voltage is supplied, and it connects during the program operation the same to a second voltage line through which a second voltage is supplied. Since the second voltage can be supplied to the transmission transistor only by the switching operation (selecting operation) of the drain switching circuit, the program operation can be started shortly after the verify operation. This can shorten the data write time to the memory cell.

8 Claims, 8 Drawing Sheets

NONVOLATILE SEMICONDUCTOR MEMORY

CROSS REFERENCE TO RELATED APPLICATION

This application is a continuation application of International Application PCT/JP 03/05280, filed Apr. 24, 2003, and designating the U.S.

BACKGROUND OF THE INVENTION

1. Field of the Invention

The present invention relates to a nonvolatile semiconductor memory and, more particularly, a method of generating a high voltage at data write.

2. Description of the Related Art

A nonvolatile semiconductor memory such as a flash memory stores logic values of write data as threshold voltages of memory cells. For example, a binary memory cell stores "logic 1" when the threshold voltage is low, and stores "logic 0" when the threshold voltage is high. Generally, operation of decreasing the threshold voltage is referred to as "erase", and operation of increasing the threshold voltage is referred to as "write" or "program".

In a NOR-type flash memory, control gates of the memory cells are connected to a word line which is selected corresponding to an address. Drains of the memory cells are connected to a bit line which is selected corresponding to the address. Sources of the memory cells are connected to a common source line.

Write operation of the data requires verify operation for checking the threshold voltage of the memory cell, and program operation for increasing the threshold voltage of the memory cell. In the verify operation, for example, a high voltage (5 V, for example) is supplied to the gates of the memory cells, and a power supply voltage (1.8 V, for example) is supplied to a gate of a transmission transistor connected to the bit lines. A voltage which is lower than the power supply voltage by a threshold voltage of the transmission transistor is supplied to the drains of the memory cells through the transmission transistor. Then, the threshold voltages of the memory cells are checked by currents flowing in the memory cells. That is, the memory cell to be programmed is identified.

In the program operation, a high voltage (9 V, for example) is supplied to the gates of the memory cells, and a high voltage (5.5 V, for example) is supplied to the drains of the memory cells through the transmission transistor. In order to transmit a drain voltage without fail, a high voltage (9 V, for example) is supplied to the gate of the transmission transistor. A charge is then trapped in a charge storing layer of the memory cell, whereby the threshold voltage is increased. Thereafter, the verify operation and the program operation are performed repeatedly until the threshold voltage of each memory cell reaches a desired value.

The above-mentioned flash memory includes a plurality of boosters for generating plural kinds of high voltages. Each booster responds to a write command to start its operation, and responds to the completion of the write operation to stop its operation (Japanese Unexamined Patent Application publication No. 2002-230985, for example).

As described above, the write operation is performed by repeating the verify operation and the program operation. Here, the gate voltage of the memory cells and the gate voltage of the transmission transistor need to be changed significantly between the verify operation and the program operation. Particularly, the gate voltage of the transmission transistor needs to be increased from 1.8 V to 9 V when shifting from the verify operation to the program operation. Boosting time until the booster generates 9 V is long, and write cycle time becomes longer.

Recently, a nonvolatile multilevel semiconductor memory which stores data of plural bits in one memory cell has been developed. In the multilevel memory cell of this kind, the program operation is performed plural times in order to set the threshold voltage accurately (step program method). Since distribution of the threshold voltages becomes narrow in the step program method, a read margin is improved. That is, the memory cell can store the multilevel data without fail. Meanwhile, in the step program method, the verify operation and the program operation are repeated for the plural times, so that one write operation is performed. Since there are a plurality of shifts from the verify operation to the program operation in one write operation, the above-described boosting time has a profound effect thereon.

SUMMARY OF THE INVENTION

It is an object of the present invention to shorten write operation time of a nonvolatile semiconductor memory.

According to a mode of a nonvolatile semiconductor memory of the present invention, a transmission transistor transmitting a drain voltage is connected to a nonvolatile memory cell which is electrically rewritable. An operation control circuit controls a program operation in which a threshold voltage of the memory cell is increased, and a verify operation which is performed before and after the program operation in order to the threshold voltage of the memory cell. A drain switching circuit connects during the verify operation a gate of the transmission transistor to a first voltage line through which a first voltage is supplied. The drain switching circuit connects during the program operation the gate of the transmission transistor to a second voltage line through which a second voltage is supplied. Since the second voltage can be supplied to the transmission transistor only by the switching operation (selecting operation) of the drain switching circuit, it is possible to start the program operation shortly after the verify operation. As a result of this, write data time to the memory cell can be shortened.

According to another mode of the nonvolatile semiconductor memory of the present invention, a first booster starts an operation during the verify operation before the program operation, to generate the second voltage on the second voltage line. Since a second voltage line can be set to the second voltage in advance before the program operation, it is possible to supply the second voltage to the gate of the transmission transistor simultaneously with the start of the program operation. This results in shortening of program operation time.

According to another mode of the nonvolatile semiconductor memory of the present invention, the operation control circuit repeats the verify and program operations until the threshold voltage of the memory cell reaches a desired value. The first booster continues to generate the second voltage on the second voltage line while the verify operation and the program operation are performed. This lowers the frequency of start and stoppage of operation of the first booster, and facilitates the control of the operation control circuit.

According to another mode of the nonvolatile memory of the present invention, a gate switching circuit connects during the verify operation the control gate of the memory cell to a third voltage line through which a third voltage is supplied. The gate switching circuit connects during the program operation the same to a fourth voltage line through which a fourth voltage is supplied. Since the fourth voltage can be supplied to the control gate of the memory cell only by switching operation (selecting operation) of the gate switching circuit, it is possible to start the program operation shortly after the verify operation. As a result of this, the data write time to the memory cell can be shortened.

According to another mode of the nonvolatile semiconductor memory of the present invention, a second booster starts an operation during the verify operation before the program operation, to generate the fourth voltage on the fourth voltage line. Since the fourth voltage line can be set to the fourth voltage in advance before the program operation, it is possible to supply the fourth voltage to the control gate of the memory cell simultaneously with the start of the program operation. This results in shortening of the program operation time.

According to another mode of the nonvolatile semiconductor memory of the present invention, the operation control circuit repeats the verify operation and the program operation until the threshold voltage of the memory cell reaches a desired value. The second booster resets the fourth voltage line to an initial voltage every time the program operation is completed. In other words, the second booster generates the fourth voltage according to the initial voltage upon every verify operation. Therefore, it is possible to accurately set the fourth voltage for each program operation, and to accurately set a threshold voltage of the memory cell to a desired value.

According to another mode of the nonvolatile semiconductor memory of the present invention, the operation control circuit sets the fourth voltage generated by the second booster to a higher value in sequence upon each of the repeated program operations. That is, the nonvolatile semiconductor memory has the so-called step program function. Since the program voltage (fourth voltage) required for each step can be accurately generated, the threshold voltages of a plurality of the memory cells can be within a desired range. As a result of this, write operation time can be shortened without a decrease in a read margin.

According to another mode of the nonvolatile semiconductor memory of the present invention, a third booster generates a fifth voltage during the verify operation and generates a sixth voltage during the program operation. An output node of the third booster is connected to a drain of the transmission transistor. The gate switching circuit selects the fifth voltage as the third voltage during the verify operation. Namely, the fifth voltage generated by the third booster during the verify operation can be used for both of the drain voltage of the transmission transistor and the control gate voltage of the memory cell. Generally, the voltage (fifth voltage) supplied to the control gate of the memory cell during the verify operation is close to the voltage (sixth voltage) supplied to the drain of the transmission transistor during the program operation. Therefore, when shifting from the verify operation to the program operation, the third booster can change its generating voltage from the fifth voltage to the sixth voltage in a short period of time. As a result of this, it is possible to start the program operation shortly after the verify operation, shortening the data write time to the memory cell.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, preferred embodiments of the present invention will be explained with reference to the drawings. In the drawings, each signal line shown by the thick line consists of a plurality of lines. Some of the blocks connected with the thick lines consist of a plurality of circuits, respectively. The signal lines through which signals (voltages) are transmitted are designated by the same reference symbols as the names of the signals.

Figure 1:
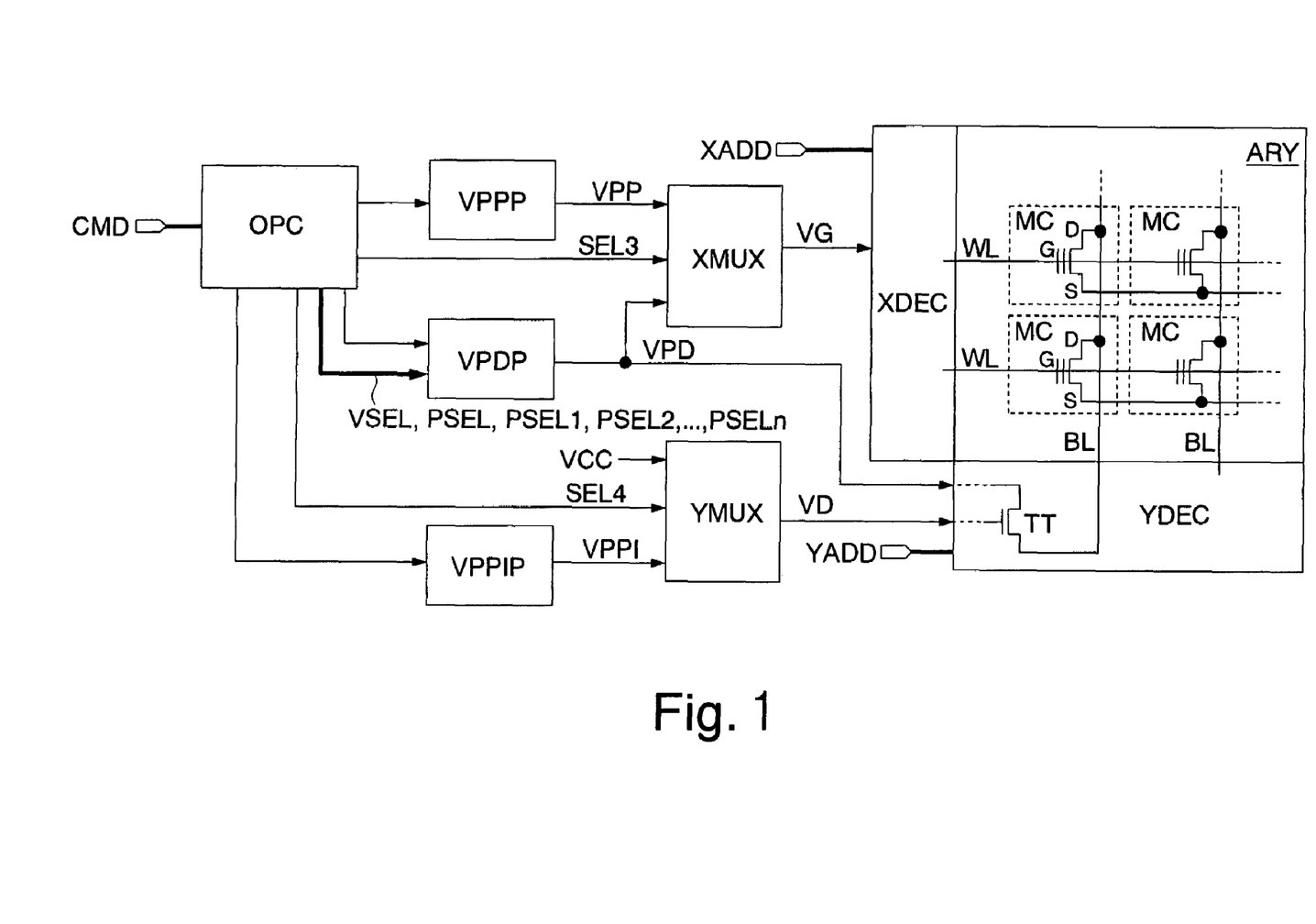
FIG. 1 is a block diagram showing a first embodiment of a nonvolatile semiconductor memory according to the present invention.

FIG. 1 shows an embodiment of a nonvolatile semiconductor memory according to the present invention. This nonvolatile semiconductor memory is formed as a NOR-type flash memory chip on a silicon substrate using CMOS process.

The flash memory includes an operation control circuit OPC, boosters VPPP, VPDP and VPPIP, multiplexers XMUX and YMUX, a row decoder XDEC, a column decoder YDEC, and a memory cell array ARY.

The operation control circuit OPC responds to command signals (chip enable signal/CE, write enable signal/WE, and the like) supplied from the exterior, to output timing signals and control signals to major circuits.

The booster VPPP (second booster) operates in synchronization with the timing signal from the operation control circuit OPC, to generate a high voltage VPP (fourth voltage) on a high voltage line VPP (fourth voltage line). The booster VPDP (third booster) operates in synchronization with the timing signal from the operation control circuit OPC, to generate a high voltage VPD (fifth or sixth voltage) corresponding to control signals VSEL or PSEL on a high voltage line VPD (third voltage line). The booster VPPIP (first booster) operates in synchronization with the timing signal from the operation control circuit OPC, to generate a high voltage VPPI (second voltage) on a high voltage line VPPI (second voltage line).

The multiplexer XMUX (gate switching circuit) responds to a control signal SEL3 from the operation control circuit OPC, to output either the high voltage VPP or the high voltage VPD to the row decoder XDEC as a gate voltage VG. The multiplexer YMUX (drain switching circuit) responds to a control signal SEL4 from the operation control circuit OPC, to output either a power supply voltage VCC (first voltage) supplied to a power supply line VCC (first voltage line) or the high voltage VPPI to a gate of a transmission transistor TT inside the column decoder YDEC.

The row decoder XDEC includes a circuit for supplying the gate voltage VG to a word line WL which is selected by a decoded signal of an address signal XADD supplied from the exterior of the flash memory. The column decoder YDEC includes the transmission transistor TT for supplying a drain voltage VD to a bit line BL which is selected by a decoded signal of an address signal YADD supplied from the exterior of the flash memory.

The memory cell array ARY includes a plurality of memory cells MC arranged in a matrix state, the word lines WL which are connected to control gates G of the memory cells arranged in the lateral direction in the drawing, the bit lines BL which are connected to drains D of the memory cells arranged in the vertical direction in the drawing, and source lines which are connected to sources S of the memory cells. The memory cell MC consists of a transistor (cell transistor) having a trap gate to store a charge. The trap gate is formed of an insulator film such as a nitride film. This prevents the charge trapped in the trap gate from moving inside the trap gate. By using it, it is possible to change a threshold voltage of the cell transistor locally. In this embodiment, the memory cell MC operates as a binary memory cell which is electrically rewritable by taking in and out the charge only to/from the trap gate.

Figure 2:
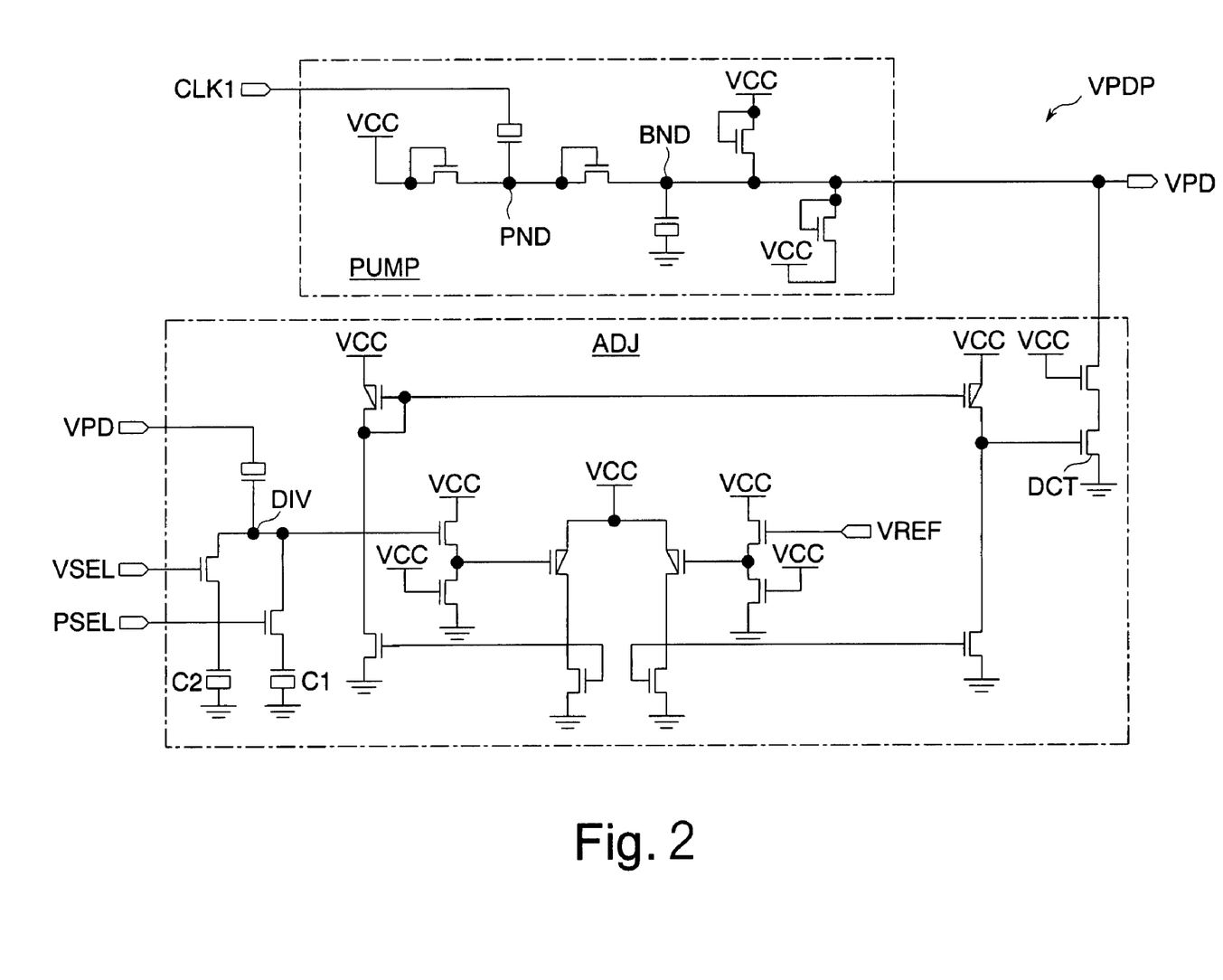
FIG. 2 is a circuit diagram showing the details of a booster VPDP shown in FIG. 1.

FIG. 2 shows the details of the booster VPDP shown in FIG. 1. In the drawing, transistors with oblique lines are pMOS transistors, and transistors without the oblique lines are nMOS transistors. Capacitors are formed by connecting sources and drains of the nMOS transistors.

The booster VPDP includes a pumping unit PUMP for generating a boosted voltage and an adjusting unit ADJ for setting the high voltage VPD to a predetermined voltage. In the pumping unit PUMP, a pumping node PND which is clamped at a predetermined positive voltage by a clamp circuit is pumped by a clock signal CLK1 through a capacitor C1 to thereby boost the power supply voltage VCC (1.8 V), and the boosted charge is transferred to a boosting node BND. The clock signal CLK1 is generated by an oscillator inside the booster VPDP in response to the control signal from the operation control circuit OPC.

In the adjusting unit ADJ, a comparison voltage DIV which is generated by dividing the high voltage VPD by the capacitor is compared with a reference voltage VREF, and a gate of a discharge transistor DCT is controlled based on the result of the comparison, whereby the high voltage VPD is set to the predetermined voltage. The reference voltage VREF is generated by a reference voltage generating circuit formed inside the flash memory. The reference voltage VREF is common to the boosters VPDP, VPPP and VPPIP. The adjusting unit ADJ connects a capacitor C2 to the node DIV when the control signal VSEL is at the high level, and connects the capacitor C1 to the node DIV when the control signal PSEL is at the high level. A capacitance of the capacitor C1 is greater than a capacitance of the capacitor C2. The operation control circuit OPC shown in FIG. 1 sets the control signals VSEL and PSEL to the high level and low level, respectively, during verify operation, and sets the control signals VSEL and PSEL to the low level and high level, respectively, during program operation. The node DIV is set to a voltage corresponding to capacitance division by the two capacitors which are connected between a high voltage node VPD and a ground line VSS. The high voltage VPD is then boosted up to 5 V (fifth voltage) and 5.5 V (sixth voltage) using the power supply voltage VCC (1.8 V) during the verify operation and the program operation, respectively. The difference of the high voltage VPD between the verify operation and the program operation is 0.5 V. This enables the high voltage VPD to be set quickly in shifting from the verify operation to the program operation.

Figure 3:
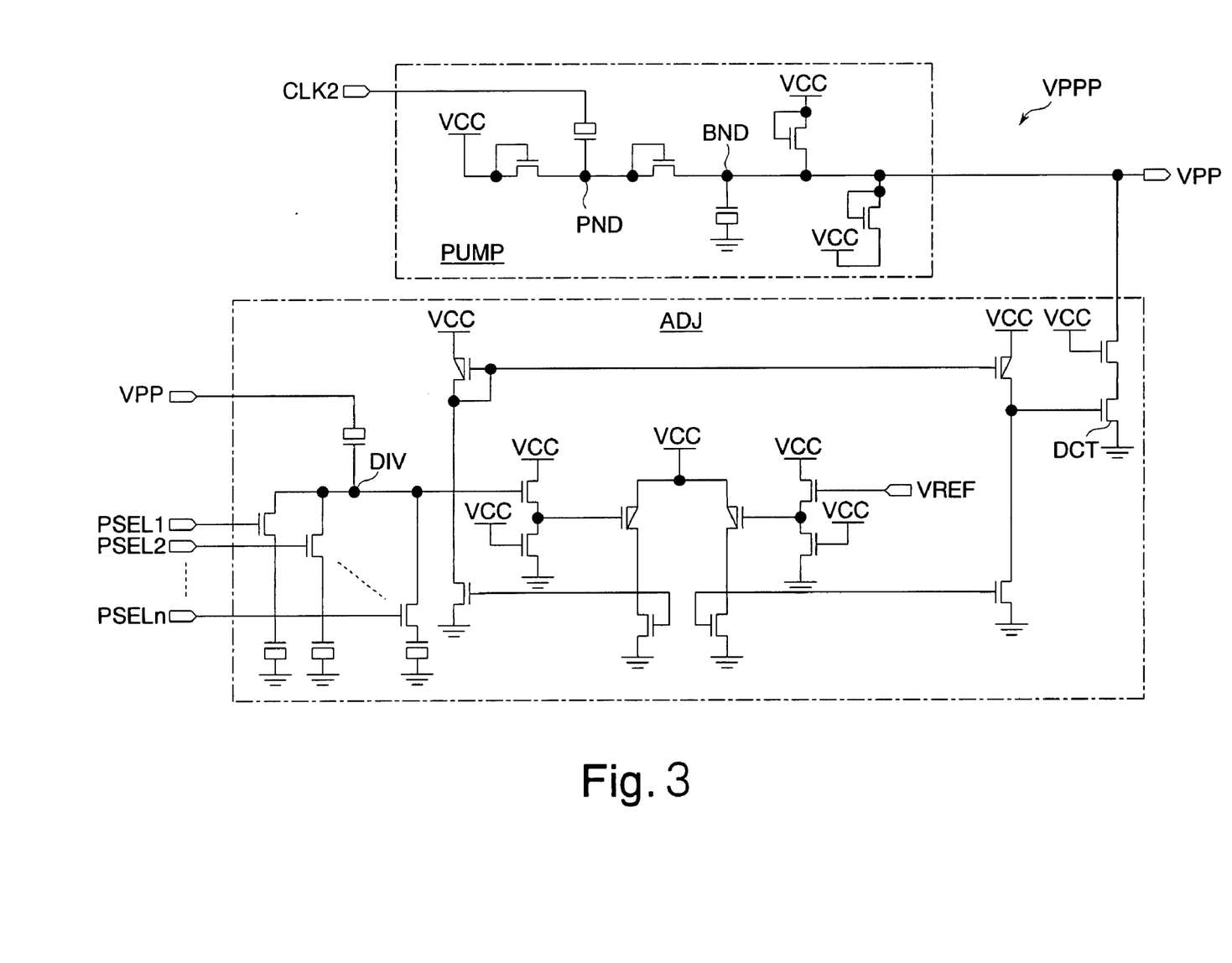
FIG. 3 is a circuit diagram showing the details of a booster VPPP shown in FIG. 1.

FIG. 3 shows the details of the booster VPPP shown in FIG. 1.

The booster VPPP includes a plurality of capacitors for setting the voltage of a node DIV in plural ways. Connection between these capacitors and the node DIV is controlled by control signals PSEL1, PSEL2, . . . , and PSELn. The control signals PSEL1, PSEL2, . . . , and PSELn are outputted from the operation control circuit OPC. In the booster VPPP, the high voltage VPP is successively increased to be 9 V, 9.1 V, 9.2 V, . . . , corresponding to the control signals PSEL1, PSEL2, . . . , and PSELn.

Figure 4:
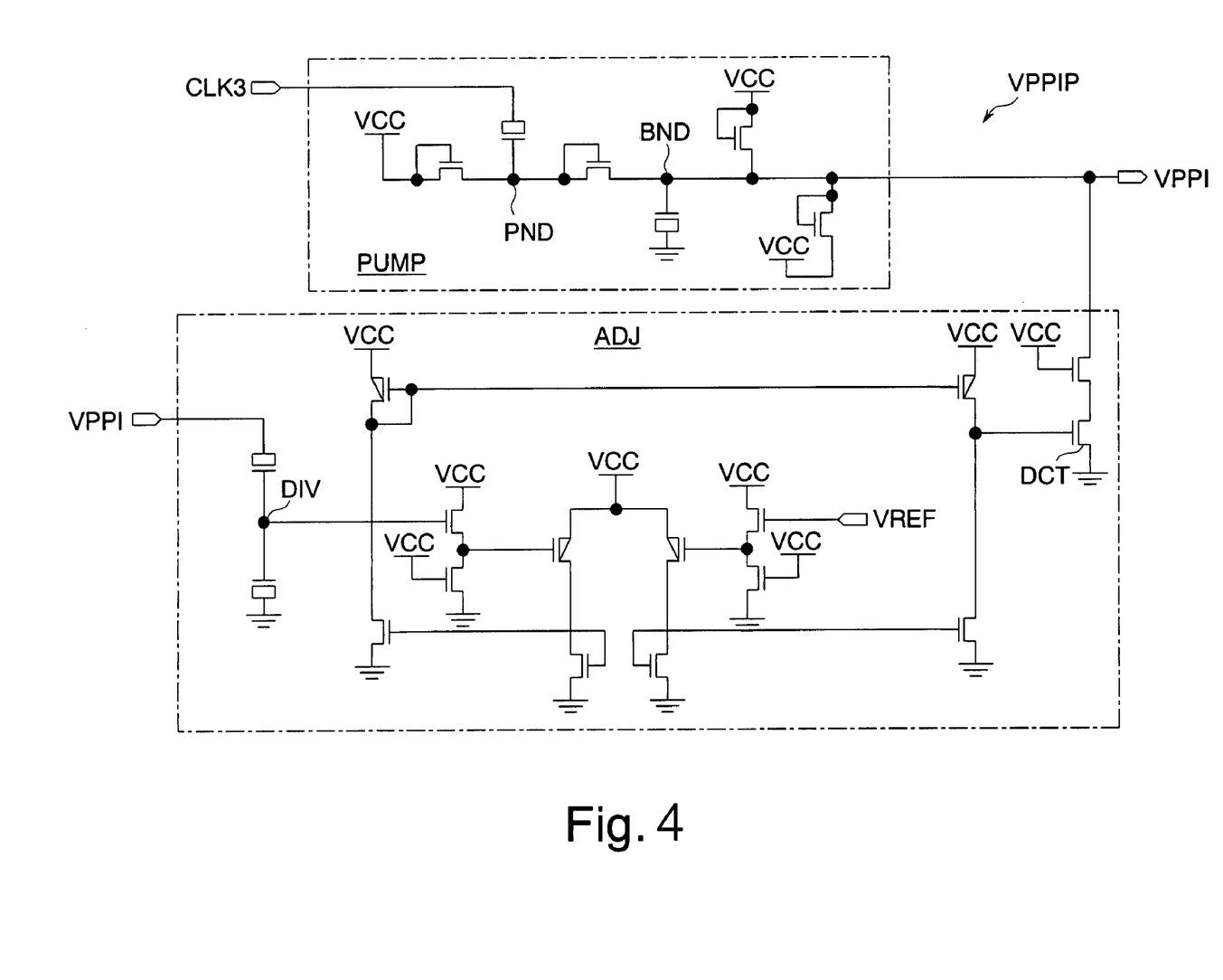
FIG. 4 is a circuit diagram showing the details of a booster VPPIP shown in FIG. 1.

FIG. 4 shows the details of the booster VPPIP shown in FIG. 1.

In the booster VPPIP, only two capacitors are connected in series through a node DIV. In other respects, it has the same logical configuration as that of the booster VPDP shown in FIG. 2. Therefore, a high voltage VPPI generated when the booster VPPIP operates is only one type. More specifically, when the booster VPPIP operates, the high voltage VPPI increases from 1.8 V (=VCC) to 9 V.

Figure 5:
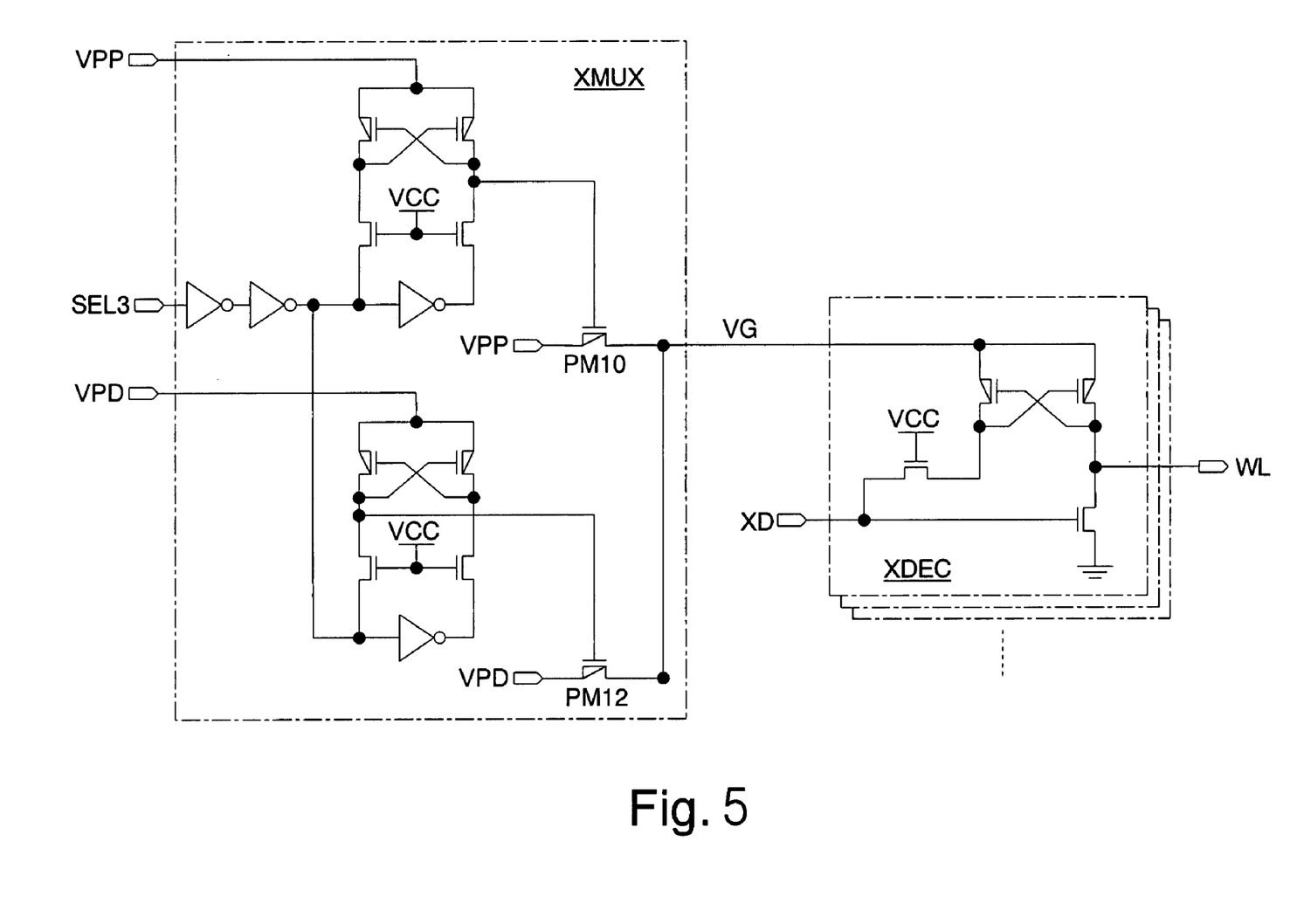
FIG. 5 is a circuit diagram showing the details of a multiplexer XMUX and a row decoder XDEC shown in FIG. 1.

FIG. 5 shows the details of the multiplexer XMUX and the row decoder XDEC shown in FIG. 1.

The multiplexer XMUX turns on a transistor PM12 when the control signal SEL3 is at the low level (verify operation), to output the high voltage VPD (third voltage) as the gate voltage VG. The multiplexer XMUX turns on a transistor PM10 when the control signal SEL3 is at the high level (program operation), to output the high voltage VPP (fourth voltage) as the gate voltage VG.

The row decoder XDEC outputs the gate voltage VG to the word line WL when a decoded signal XD (negative logic) of the address signal XADD is at the low level, and outputs the ground voltage to the word line WL when the decoded signal XD is at the high level. That is, the gate voltage VG is supplied to the word line WL which is selected by the address signal XADD.

Figure 6:
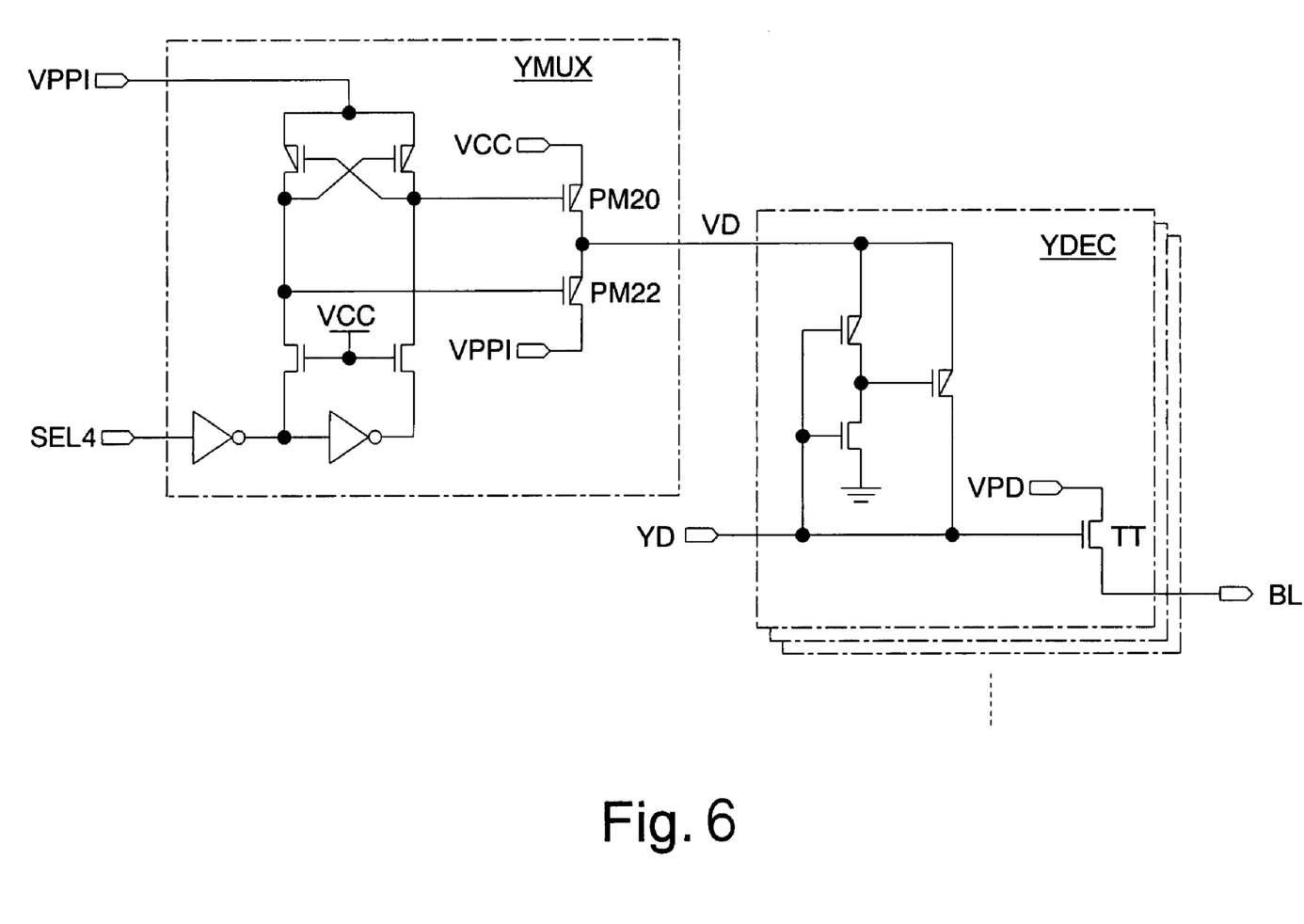
FIG. 6 is a circuit diagram showing the details of a multiplexer YMUX and a column decoder YDEC shown in FIG. 1.

FIG. 6 shows the details of the multiplexer YMUX and the column decoder YDEC shown in FIG. 1.

The multiplexer YMUX turns on a transistor PM20 when the control signal SEL4 is at the low level (verify operation), to output the power supply voltage VCC (first voltage) as the drain voltage VD. The multiplexer YMUX turns on a transistor PM22 when the control signal SEL4 is at the high level (program operation), to output the high voltage VPPI (second voltage) as the drain voltage VD.

The column decoder YDEC includes the transmission transistor TT which transmits the high voltage VPD to the bit line BL. The transmission transistor TT turns on when a decoded signal YD (positive logic) of the address signal YADD is at the high level, to output the high voltage VPD to the bit line BL (the drain of the memory cell MC). That is, the high voltage VPD is supplied to the bit line BL which is selected by the address signal YADD. The transmission transistor TT turns off when the decoded signal YD is at the low level, and allows the bit line BL to enter a floating state. It should be noted that, in actuality, the value of the voltage transmitted to the bit line BL is maximized when a threshold voltage of the transmission transistor TT is subtracted from the gate voltage of the transmission transistor TT.

Figure 7:
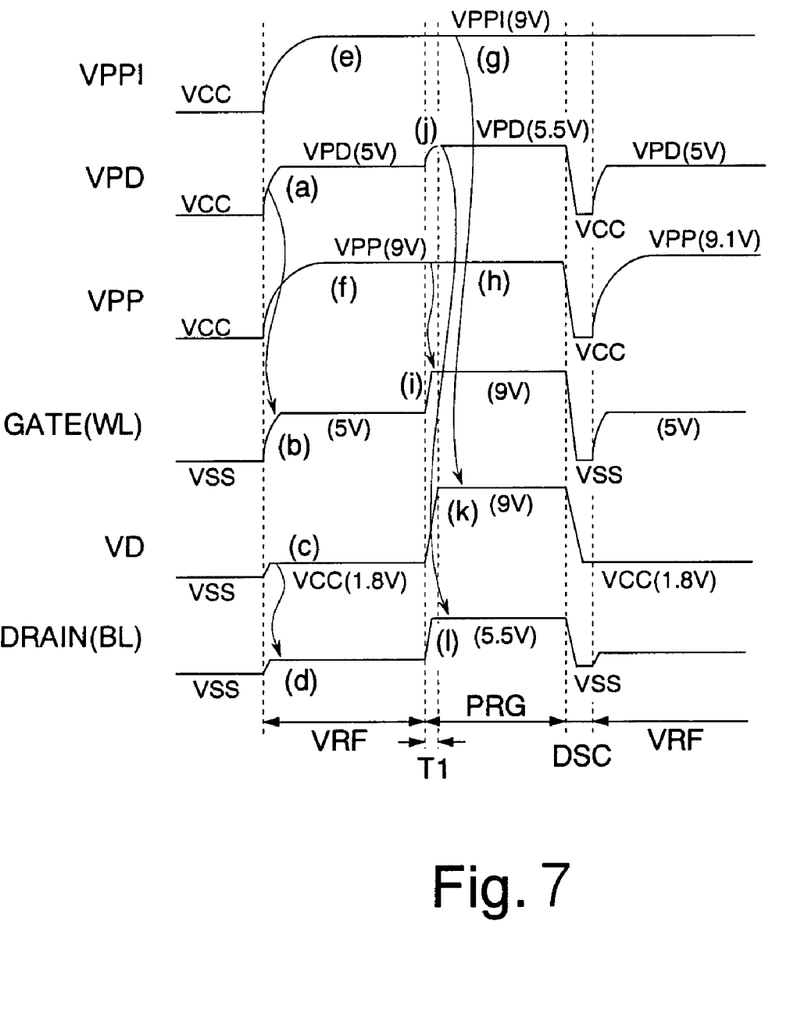
FIG. 7 is a waveform chart showing write operation of a flash memory according to the present invention.

FIG. 7 shows write operation of the flash memory according to the present invention.

Incidentally, the write operation is the operation for programming "logic 0" to the memory cell MC. According to this embodiment, a step program method is adopted for the write operation, in which the verify operation and the program operation are repeated and the threshold voltage of the memory cell MC is increased gradually to set the voltage to an expected value.

In the first verify period VRF, the verify operation is first performed in order to check the threshold voltage of the memory cell MC. In the verify operation, the booster VPDP generates 5 V at the node VPD (FIG. 7(a)). The multiplexer XMUX selects the node VPD in the verify period VRF. Accordingly, the row decoder XDEC which is selected corresponding to the address signal XADD changes the corresponding word line WL to 5 V. Then, the gate voltage GATE of the memory cells MC is set to 5 V (FIG. 7(b)).

The multiplexer YMUX outputs the power supply voltage VCC (1.8 V) to the node VD in the verify period VRF (FIG. 7(c)). The column decoder YDEC which is selected corresponding to the address signal YADD sets the gate of the transmission transistor TT to the power supply voltage VCC. Accordingly, the drain voltage DRAIN (bit line BL) of the memory cells MC is set to a value of the power supply voltage VCC subtracted the threshold voltage of the transmission transistor therefrom (FIG. 7(d)). Then, the memory cell MC to be programmed is determined corresponding to the current flowing in the memory cell MC.

Incidentally, the boosters VPPIP and VPPP start the operation in the verify period VRF to generate the high voltages VPPI and VPP, respectively (FIG. 7(e, f)). Since the high voltages VPPI and VPP which are necessary for the program operation are started to be generated in advance during the verify operation before the program operation, it is possible to start the program operation promptly.

After the verify operation, the program operation is performed to the memory cell MC which needs the data to be written. In a program period PRG when the program operation is performed, the boosters VPPIP and VPPP have already generated the boosted voltages VPPI and VPP (FIG. 7(g, h)). The multiplexer XMUX responds to the control signal SEL3 to stop the selection of the boosted voltage VPD and start the selection of the boosted voltage VPP. Then, the boosted voltage VPP (9 V) is outputted to the node VG. The row decoder XDEC which is selected corresponding to the address signal XADD changes the corresponding word line WL to the boosted voltage VPP. Then, the gate voltage GATE of the memory cells MC is set to 9 V (FIG. 7(i)).

The booster VPDP responds to the control signals VSEL and PSEL to change the boosted voltage VPD from 5 V to 5.5 V (FIG. 7(j)). The multiplexer YMUX responds to the control signal SEL4 to stop the selection of the power supply voltage VCC and start the selection of the boosted voltage VPPI. Then, the boosted voltage VPPI (9 V) is outputted to the node VD (FIG. 7(k)). The column decoder YDEC which is selected corresponding to the address signal YADD sets the gate of the transmission transistor TT to the boosted voltage VPPI. Accordingly, the drain voltage DRAIN (bit line BL) of the memory cells MC is set to the boosted voltage VPD (5.5 V) (FIG. 7(l)). Then, the program operation to increase the threshold voltage is performed to the memory cell MC which is selected by the word line WL and bit line BL.

In the program period PRG, the boosted voltages VPP and VPPI have been already generated in the verify period VRF. Further, the voltage to be newly increased by the booster VPDP is 0.5 V, and the boosted voltage VPD is increased to 5.5 V in a short period of time. Therefore, a period T1 which is required for setting the gate voltage GATE and the drain voltage DRAIN depends only on a switching period between the multiplexers XMUX and YMUX. In other words, a period required for generating the boosted voltages VPP and VPPI is not included in the program period PRG. Accordingly, the program period PRG is shortened, and write operation time is shortened.

Next, after a discharge period DSC, the verify operation is performed again in order to check the threshold voltage of the memory cell MC. When it is determined in the verify operation that the threshold voltage of the memory cell MC to be programmed is low, the program operation (not shown) is performed again (step program method). In the discharge period DSC, the boosted voltages VPD and VPP are reset to the power supply voltage VCC. The boosted voltage VPPI is not reset and kept at 9 V. The gate voltage GATE and drain voltage DRAIN are set to the ground voltage VSS.

Since the boosted voltage VPP is reset to the power supply voltage VCC, it is possible to accurately generate the gate voltage GATE which needs to increase by 0.1 V for each program operation. Moreover, since the boosted voltage VPPI is kept at 9 V, it is unnecessary for the booster VPPIP to repeat the operation and stoppage during one write operation. This facilitates the control of the operation control circuit OPC.

Figure 8:
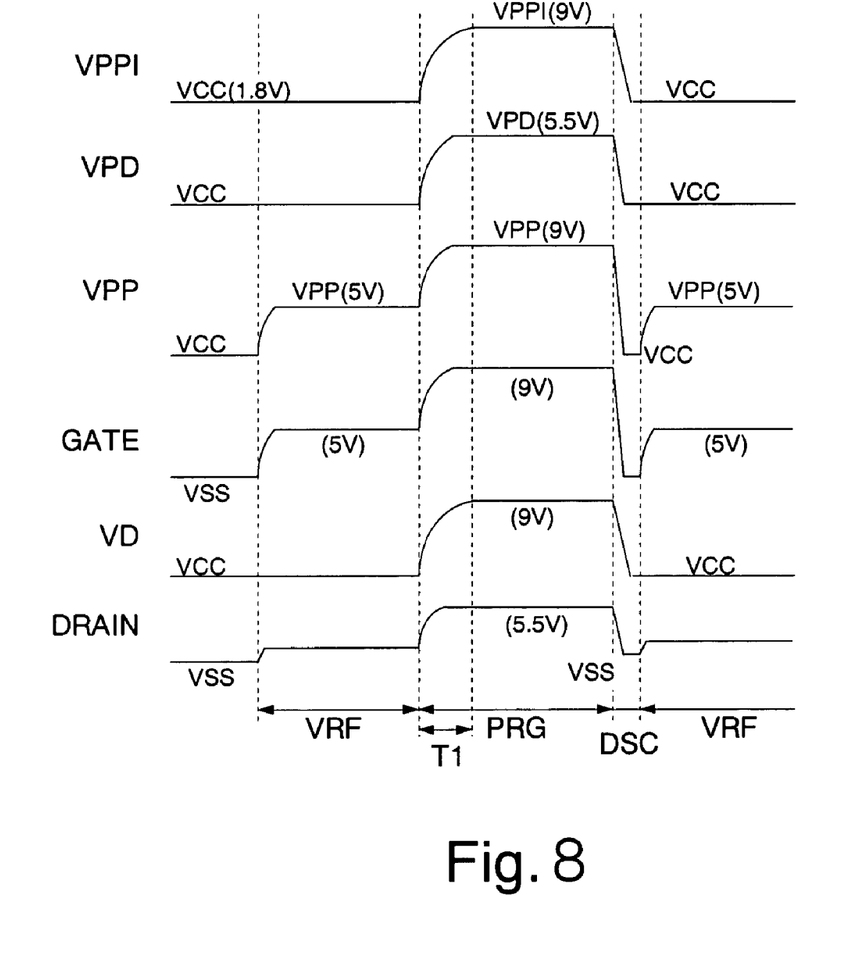
FIG. 8 is a waveform chart showing write operation of a flash memory before the present invention.

FIG. 8 shows write operation of a flash memory before the present invention.

In the flash memory of the step program method before the present invention, boosted voltages VPPI, VPD and VPP are started to be generated in response to the start of program operation. Therefore, a period T1 which is required for setting a gate voltage GATE and drain voltage DRAIN in a program period PRG depends on a period for generating the boosted voltages VPPI, VPD and VPP by boosters, respectively. Accordingly, the period T1 gets longer than that of FIG. 7 described above, and the program period PRG gets longer. Particularly, the time T1 occurs for a plurality of times in the step program method, and hence it has a profound effect on the write operation time.

As described thus far, according to this embodiment, the booster VPPIP starts the generation of the boosted voltage VPPI in the verify period VRF which is before the program period PRG. Consequently, the boosted voltage VPPI can be supplied to the gate of the transmission transistor TT in the program period PRG only by the switching operation by the multiplexer YMUX according to the control signal SEL4. This enables the program operation to be started immediately after the verify operation. As a result of this, the data write time to the memory cell MC can be shortened.

Similarly, in the write operation of the data, the booster VPPP starts the generation of the boosted voltage VPP in the verify period VRF which is before the program period PRG. Consequently, the boosted voltage VPP can be supplied to the control gates of the memory cells MC in the program period PRG only by the switching operation by the multiplexer XMUX according to the control signal SEL3. This enables the program operation to be started immediately after the verify operation. As a result of this, the data write time to the memory cell MC can be shortened.

In the flash memory employing the step program method, the booster VPPIP keeps on generating the boosted voltage VPPI throughout the write operation. Accordingly, the booster VPPIP can decrease the frequency of the operation and stoppage, whereby the control of the operation control circuit OPC is facilitated.

Moreover, the operation control circuit OPC sets the boosted voltage VPP generated by the booster VPPP to be higher by 0.1 V successively for each program operation which is performed repeatedly. The booster VPPP resets the boosted voltage VPP to the power supply voltage VCC every time the program operation is completed. Since the boosted voltage VPP is generated based on the power supply voltage VCC for each program, it is possible to accurately set the boosted voltage VPP (program voltage) required for each step, and to accurately set the threshold voltage of the memory cell MC to the desired value.

The booster VPDP generates the boosted voltage VPD of 5 V to be supplied to the control gates of the memory cells MC in the verify period VRF, and generates the boosted voltage VPD of 5.5 V to be supplied to the drains of the memory cells MC in the program period PRG. By using the boosted voltage VPDP for both of the gate voltage GATE and the drain voltage DRAIN of the memory cells MC, it is possible to generate the boosted voltages to be used in the verify operation and the program operation with efficiency.

The difference between the gate voltage GATE used in the verify operation and the drain voltage DRAIN used in the program operation is as small as 0.5 V. Accordingly, the booster VPDP can change the boosted voltage VPD from 5 V to 5.5 V in a short period of time, in shifting from the verify operation to the program operation. As a result of this, the program operation can be started shortly after the verify operation, and the data write time to the memory cell can be shortened.

Incidentally, the foregoing embodiment has dealt with the case where the present invention is applied to the flash memory chip. However, the present invention is not limited to such an embodiment. For example, the present invention may be applied to a flash memory core embedded in a system LSI.

The foregoing embodiment has dealt with the case where the present invention is applied to the flash memory having the binary memory cells. However, the present invention is not limited to such an embodiment. For example, the present invention may be applied to a flash memory having multi-level memory cells.

The foregoing embodiment has dealt with the case where the present invention is applied to the NOR-type flash memory. However, the present invention is not limited to such an embodiment. For example, the present invention may be applied to a flash memory of a NAND type or virtual ground type.

The foregoing embodiment has dealt with the case where the present invention is applied to the write operation of the memory cell having the trap gate. However, the present invention is not limited to such an embodiment. For example, the present invention may be applied to write operation of a memory cell having a floating gate.

The invention is not limited to the above embodiments and various modifications may be made without departing from the spirit and scope of the invention. Any improvement may be made in part or all of the components.

What is claimed is:

1. A nonvolatile semiconductor memory comprising:
   a nonvolatile memory cell having a control gate, a drain and a source, and being electrically rewritable;
   a transmission transistor connected to the drain at its source, for transmitting a drain voltage to the drain of said memory cell;
   an operation control circuit controlling a program operation in which a threshold voltage of said memory cell is increased, and a verify operation which is performed before and after the program operation in order to verify the threshold voltage of said memory cell; and
   a drain switching circuit connecting, during the verify operation, a gate of said transmission transistor to a first voltage line through which a first voltage is supplied, and connecting, during the program operation, the gate to a second voltage line through which a second voltage is supplied.

2. The nonvolatile semiconductor memory according to claim 1, further comprising
   a first booster starting operating during the verify operation before the program operation, to generate the second voltage on the second voltage line.

3. The nonvolatile semiconductor memory according to claim 1, further comprising
   a gate switching circuit connecting, during the verify operation, the control gate of said memory cell to a third voltage line through which a third voltage is supplied, and connecting, during the program operation, the control gate to a fourth voltage line through which a fourth voltage is supplied.

4. The nonvolatile semiconductor memory according to claim 2, wherein:
   said operation control circuit repeats the verify and program operations until the threshold voltage of said memory cell reaches a desired value; and
   said first booster continues to generate the second voltage on the second voltage line during the verify and program operations.

5. The nonvolatile semiconductor memory according to claim 3, further comprising
   a second booster starting operating during the verify operation before the program operation, to generate the fourth voltage on the fourth voltage line.

6. The nonvolatile semiconductor memory according to claim 3, wherein:
   said operation control circuit repeats the verify and program operations until the threshold voltage of said memory cell reaches a desired value; and
   said second booster resets the fourth voltage line to an initial voltage every time the program operation is completed.

7. The nonvolatile semiconductor memory according to claim 3, further comprising
   a third booster connected to a drain of said transmission transistor at its output node, generating a fifth voltage during the verify operation and generating a sixth voltage during the program operation, wherein
   said gate switching circuit selects the fifth voltage as the third voltage during the verify operation.

8. The nonvolatile semiconductor memory according to claim 6, wherein
   said operation control circuit sets the fourth voltage generated by said second booster to a higher value in sequence upon each of the repeated program operations.

* * * * *